US012462741B1

(12) United States Patent
Zhang et al.

(10) Patent No.: US 12,462,741 B1
(45) Date of Patent: Nov. 4, 2025

(54) DISPLAY CIRCUIT AND DISPLAY DEVICE

(71) Applicant: WUHAN CHINA STAR OPTOELECTRONICS TECHNOLOGY CO., LTD., Hubei (CN)

(72) Inventors: Zhou Zhang, Hubei (CN); Xialing Liu, Hubei (CN); Changwen Ma, Hubei (CN); Pan Xu, Hubei (CN); Zhe Li, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 19/041,967

(22) Filed: Jan. 30, 2025

(30) Foreign Application Priority Data

Aug. 28, 2024 (CN) .......................... 202411197779.0

(51) Int. Cl.
*G09G 3/32* (2016.01)
*G02F 1/1335* (2006.01)
*G02F 1/1343* (2006.01)

(52) U.S. Cl.
CPC ......... *G09G 3/32* (2013.01); *G02F 1/133512* (2013.01); *G02F 1/134309* (2013.01); *G09G 2300/0819* (2013.01); *G09G 2320/041* (2013.01); *G09G 2320/046* (2013.01); *G09G 2354/00* (2013.01); *G09G 2360/144* (2013.01)

(58) Field of Classification Search
CPC ............ G09G 3/32; G09G 2300/0819; G09G 2320/041; G09G 2320/046; G09G 2354/00; G09G 2360/144; G02F 1/133512; G02F 1/134309
See application file for complete search history.

(56) References Cited

U.S. PATENT DOCUMENTS

| | | | |
|---|---|---|---|
| 10,984,712 B2 * | 4/2021 | Brownlow | G09G 3/3275 |
| 11,170,721 B2 * | 11/2021 | Uchino | G09G 3/3291 |
| 11,984,080 B2 * | 5/2024 | Chen | G09G 3/3233 |
| 2023/0360570 A1 * | 11/2023 | Moradi | G09G 3/3233 |

* cited by examiner

*Primary Examiner* — Pegeman Karimi
(74) *Attorney, Agent, or Firm* — PV IP PC; Wei Te Chung

(57) ABSTRACT

A display circuit includes a first control transistor and a second control transistor. A gate of the first control transistor is connected to a second scan line. A first electrode of the first control transistor is connected to an anode of a light-emitting device. A gate of the second control transistor is connected to a third scan line. A first electrode of the second control transistor is connected to a collection module. A reading signal line is connected to an ADC module, and second electrodes of the first and second control transistors of each pixel driving circuit. In a compensation stage, active levels are input into the first and second scan lines, and an inactive level is input into the third scan line. In a collection phase, an inactive level is input into the second scan line and an active level is input into the third scan line.

20 Claims, 6 Drawing Sheets

DISPLAY CIRCUIT AND DISPLAY DEVICE

CROSS-REFERENCE TO RELATED APPLICATION

This application claims priority to and the benefit of Chinese Patent Application No. 202411197779.0, filed on Aug. 28, 2024, the disclosure of which is incorporated herein by reference in its entirety.

TECHNICAL FIELD

The present application relates to the field of display technology, and in particular, to a display circuit and a display device.

BACKGROUND

With the development of display technology, micro-light emitting diode (Micro-LED, MLED) display devices are widely used due to their advantages such as high brightness, fast response speeds, and long lives. In an MLED display device, in order to prevent display nonuniformity caused by a threshold voltage drift and mobility of transistors, the threshold voltage and mobility of the transistors need to be compensated. Specifically, an external circuit may be used to perform compensation after data collection. In addition, the MLED display device further needs another external circuit for fingerprint recognition, which results in too many external circuits and wiring in the MLED display device, causing high complexity of the MLED display device.

Therefore, existing MLED display devices generally require excessive external circuits and wires, resulting in high complexity.

SUMMARY

Some embodiments of the present disclosure provide a display circuit, including:
  multiple pixel driving circuits arranged in multiple stages, wherein each pixel driving circuit includes a switch transistor, a drive transistor, and a first control transistor, a gate of the switch transistor is connected to a first scan line, a first electrode of the switch transistor and a gate of the drive transistor is connected to a first node, the drive transistor is electrically connected to an anode of a light-emitting device, a gate of the first control transistor is connected to a second scan line, and a first electrode of the first control transistor is connected to the anode of the light-emitting device;
  multiple collection circuits arranged in multiple stages, wherein each collection circuit comprises a second control transistor and a collection module, a gate of the second control transistor is connected to a third scan line, and a first electrode of the second control transistor is connected to the collection module;
  a compensation circuit comprising a read signal line and an analog-to-digital conversion module, wherein the read signal line is connected to a second electrode of the second control transistor of each pixel driving circuit, is connected to a second electrode of the second control transistor of each collection circuit, and is further electrically connected to the analog-to-digital conversion module;
  wherein when the display circuit is configured to be in a compensation phase, active voltage levels are respectively input into the first scan line and the second scan line, and an inactive voltage level is input into the third scan line; and when the display circuit is configured to be in a collection phase, an inactive voltage level is input into the second scan line, and an active voltage level is input into the third scan line.

In some embodiments, the collection circuit includes one of a temperature-sensitive sensor collection circuit and an optical sensor collection circuit.

In some embodiments, the collection module includes a first collection transistor and a second collection transistor. A gate and a first electrode of the first collection transistor is connected to a first high-level power supply line, a second electrode of the first collection transistor and a second electrode of the second collection transistor are connected with the first electrode of the second control transistor. The first electrode of the second control transistor are connected to a fourth node, a gate of the second collection transistor is connected to a first control line, and a first electrode of the second collection transistor is connected to a first low-level power supply line.

In some embodiments, the collection module includes a temperature-sensitive resistor and a fixed resistor. One terminal of the temperature-sensitive resistor is connected to a first high-level power supply line, and the other terminal of the temperature-sensitive resistor is connected to the first electrode of the second control transistor. One terminal of the fixed resistor is connected to a first low-level power supply line, and the other terminal of the fixed resistor is connected to the first electrode of the second control transistor.

In some embodiments, the collection module includes a third collection transistor, a fourth collection transistor, a first capacitor, a second capacitor, a first frequency ring oscillator, and a second frequency ring oscillator. A gate of the third collection transistor is connected to one terminal of the first frequency ring oscillator. One terminal of the second frequency ring oscillator, and one electrode plate of the first capacitor. A first electrode of the third collection transistor is connected to a second high-level power supply line. A second electrode of the third collection transistor is connected to one electrode plate of the second capacitor, the other terminal of the first frequency ring oscillator, and a first electrode of the fourth collection transistor. A gate of the fourth collection transistor is connected to a second control line, a second electrode of the fourth collection transistor is connected to a second low-level signal line. The other electrode plate of the first capacitor and the other electrode plate of the second capacitor are connected to the second low-level signal line. The other terminal of the second frequency ring is connected to the first electrode of the second control transistor.

In some embodiments, the collection module includes a fifth collection transistor, a sixth collection transistor, a first current source, a second current source, and a differentiator. A first electrode of the fifth collection transistor is connected to a third high-level power supply line, and a gate of the fifth collection transistor and a second electrode of the fifth collection transistor are connected to the first current source and an input terminal of the differentiator. A first electrode of the sixth collection transistor is connected to the third high-level power supply line, and a gate and a second electrode of the sixth collection transistor are connected to the second current source and the other input terminal of the differentiator. An output terminal of the differentiator is connected to the first electrode of the second control transistor.

In some embodiments, the collection module includes a photodiode, an anode of the photodiode is connected to the first electrode of the second control transistor, and a cathode of the photodiode is connected to a first low-level power supply line.

In some embodiments, the display circuit includes a plurality of collection circuits arranged in an array, and the number of the read signal lines is greater than or equal to the number of columns of the array.

In some embodiments, the compensation circuit further includes a first switch, a second switch, and a reset signal line. One terminal of the first switch is connected to the reset signal line, and the other terminal of the first switch is connected to the read signal line. One terminal of the second switch is connected to the analog-to-digital conversion module, and the other terminal of the second switch is connected to the read signal line.

In addition, some other embodiments of the present disclosure provide a display device including the display circuit as described in any of the above embodiments. The display device further includes:
- a first substrate;
- a display panel provided on one side of the first substrate;
- a liquid crystal layer disposed on a side of the display panel facing away from the first substrate;
- a control electrode layer disposed on a side of the liquid crystal layer facing away from the display panel; and
- a second substrate disposed on a side of the control electrode layer facing away from the liquid crystal layer.

In some embodiments, the display panel includes photodiodes and light-emitting units, the display panel has a plurality of sub-regions. Each sub-region is provided with two or more of the light-emitting units and one of the photodiodes. The control electrode layer includes a plurality of control electrodes arranged at intervals, and each control electrode is arranged corresponding to one of the plurality of sub-regions.

In some embodiments, the display panel includes a first electrode layer, a first insulating layer, a second electrode layer, a second insulating layer, and a third electrode layer. The first electrode layer is disposed on a side of the second electrode layer facing toward the liquid crystal layer, the third electrode layer is disposed on a side of the second electrode layer away from the first electrode layer, and the first electrode layer includes a common electrode.

In some embodiments, the photodiode is disposed on a side of the third electrode layer facing toward the second electrode layer, and the third electrode layer includes light-shielding metal, and the light-shielding metal is configured corresponding to the photodiode.

BRIEF DESCRIPTION OF THE DRAWINGS

The technical solutions and other beneficial effects of the present disclosure will be apparent through a detailed description of specific embodiments of the present disclosure in conjunction with the accompanying drawings.

DETAILED DESCRIPTION

Figure 1:
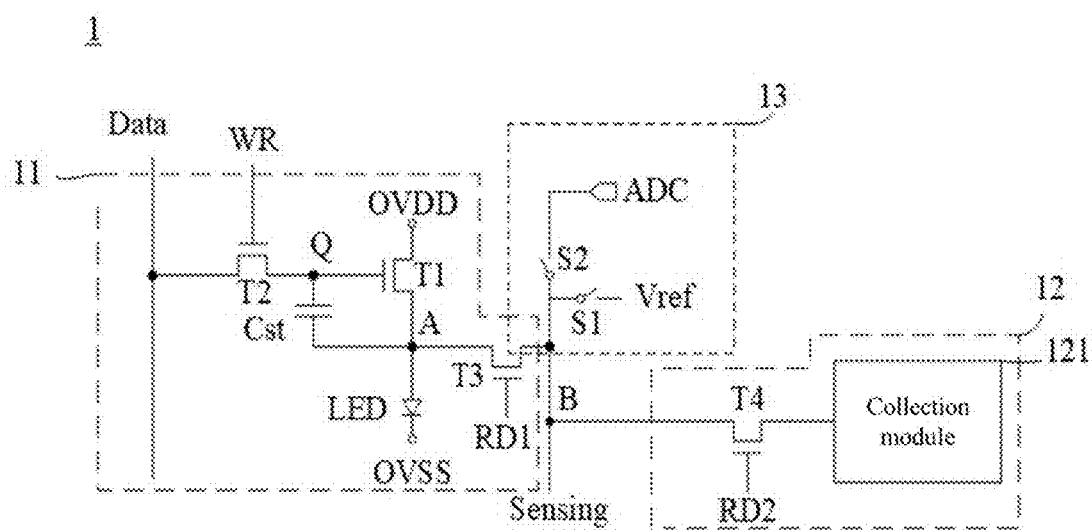
FIG. 1 is a circuit diagram of a display circuit according to some embodiments of the present disclosure.

The technical solutions in the embodiments of the present disclosure will be clearly and completely described below with reference to the accompanying drawings in the embodiments of the present disclosure. The described embodiments are only some of the embodiments of the present disclosure, rather than all of the embodiments. Based on the embodiments in the present disclosure, all other embodiments obtained by those skilled in the art without making creative efforts fall within the scope of protection of the present disclosure.

In the description of the present disclosure, it should be understood that the terms indicating orientations or positional relationships such as "center", "longitudinal", "transverse", "length", "width", "thickness", "upper", "lower", "front", "back", "left", "right", "vertical", "horizontal", "top", "bottom", "inside", "outside", "clockwise", "counterclockwise" are based on orientations or positional relationships shown in the drawings, and are only for the convenience of describing the present disclosure and simplifying the description, rather than indicating or implying that the device or element referred to must have a specific orientation or must be constructed and operated in a specific orientation, and therefore should not be construed as limiting the present disclosure. In addition, the terms "first" and "second" are used for descriptive purposes only and cannot be understood as indicating or implying relative importance or implicitly indicating the quantity of indicated technical features. Thus, features defined by "first" and "second" may explicitly or implicitly include one or more of the described features. In the description of the present disclosure, "plurality" means two or more than two, unless otherwise explicitly and specifically limited.

In the description of the present disclosure, it should be noted that, unless otherwise clearly stated and limited, the terms "install", "connect" and "couple" should be understood in a broad sense. For example, these terms may refer to a fixed connection, a detachable connection, or an integral connection; a mechanical connection, an electrical connection, or mutual communication; and a direct connection, an indirect connection through an intermediary, an internal connection of two elements, or an interaction relation of two elements. For those of ordinary skill in the art, the specific meanings of the above terms in the present disclosure may be understood according to specific circumstances.

In the present disclosure, unless otherwise expressly stated and limited, a first feature being "above" or "below" a second feature may include the first feature directly contacting the second feature, and the first feature indirectly contacting the second feature through an additional feature therebetween. Furthermore, the first feature being "above", "on", and "over" the second feature may include the first feature being directly above and diagonally above the second feature, or may simply mean that the first feature is higher in level than the second feature. The first feature being "below", "under", and "beneath" the second feature may include the first feature being directly below and diagonally below the second feature, or may simply mean that the first feature is lower in level than the second feature.

The following disclosure provides many different embodiments or examples for implementing various structures of the present disclosure. To simplify the disclosure of the present disclosure, the components and arrangements of specific examples are described below. Of course, they are merely examples and are not intended to limit the present disclosure. Furthermore, the present disclosure may repeat reference numbers and/or reference letters in different examples, such repetition is for the purposes of simplicity and clarity and does not by itself indicate a relationship between the various embodiments and/or arrangements discussed. In addition, the present disclosure provides various examples of specific processes and materials, but one of ordinary skill in the art will recognize applications of other processes and/or use of other materials.

Embodiments of the present disclosure provides display circuits and display devices, to reduce external circuits and wires required by conventional MLED display devices, thereby reducing complexity of the MLED display devices.

Figure 2:
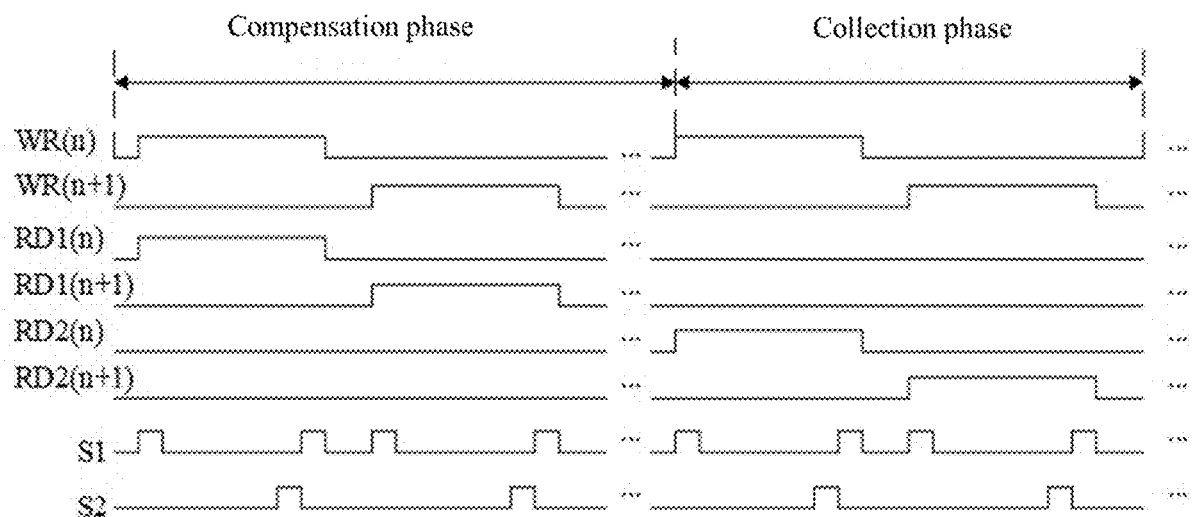
FIG. 2 is a timing diagram corresponding to the circuit diagram of the display circuit shown in FIG. 1.

As shown in FIGS. 1 and 2, some embodiments of the present application provide a display circuit 1. The display circuit 1 includes pixel driving circuits 11 in multiple stages, collection circuits 12 in multiple stages, and a compensation circuit 13. The pixel driving circuit 11 in each stage includes a switch transistor T2, a drive transistor T1, a first control transistor T3, and a light-emitting device LED. A gate of the switch transistor T2 is connected to a first scan line WR, and a first electrode of the switch transistor T2 and a gate of the drive transistor T1 are connected to a first node Q. The drive transistor T1 is electrically connected to an anode of the light-emitting device LED. A gate of the first control transistor T3 is connected to a second scan line RD1, and a first electrode of the first control transistor T3 and the anode of the light-emitting device LED are connected to a second node A. The collection circuit 12 in each stage includes a second control transistor T4 and a collection module 121. A gate of the second control transistor T4 is connected to a third scan line RD2, and a first electrode of the second control transistor T4 is connected to the collection module 121. The compensation circuit 13 includes a read signal line Sensing and an analog-to-digital conversion module ADC. The read signal line Sensing is connected to a second electrode of the first control transistor T3 of the pixel driving circuit 11 in each stage, is connected to a second electrode of the second control transistor T4 of the collection circuit 12 in each stage via a third node B, and is electrically connected to the analog-to-digital conversion module ADC.

When the display circuit 1 is configured to be in a compensation phase, active levels are respectively input into the first scan line WR and the second scan line RD1, and an inactive level is input into the third scan line RD2. When the display circuit 1 is configured to be in a collection phase, an inactive level is input into the second scan line RD1, and an active level is input into the third scan line RD2.

The above embodiments of the present disclosure provide a display circuit including the first control transistor and the second control transistor. The gate of the first control transistor is connected to the second scan line, and the first electrode of the first control transistor is connected to the anode of the light-emitting device. The gate of the second control transistor is connected to the third scan line, and the first electrode of the second control transistor is connected to the collection module. The read signal line is connected to the second electrode of the first control transistor of the pixel driving circuit in each stage, is connected to the second electrode of the second control transistor of the collection circuit in each stage, and is further is electrically connected to the analog-to-digital conversion module. When the display circuit is configured to be in the compensation phase, the first scan line and the second scan line receive the active levels as inputs, and the third scan line receives the inactive level as input. When the display circuit is configured to be in the collection phase, the second scan line receives the inactive level as input, and the third scan line receives the active level as input. In such cases, in the compensation phase, the first control transistor may be turned on and the second control transistor may be turned off to compensate for the pixel driving circuit. Further, in the collection phase, the second control transistor may be turned on and the first control transistor may be turned off to allow the collection circuit to collect signals. In this way, the pixel driving circuit and the collection circuit share the compensation circuit, thereby reducing the number of compensation circuits and further reducing complexity and cost of the display device.

Specifically, the display device includes pixel units arranged in an array. Each pixel unit will be provided with a corresponding pixel driving circuit 11. Therefore, each column of pixel units in the array will have a corresponding column of pixel driving circuits 11 (i.e., the pixel driving circuits 11 in multiple stages). When the compensation circuit(s) is used to collect data in the pixel driving circuit(s), a single compensation circuit 12 may be used to collect data from one or more columns of pixel driving circuits 11. Therefore, the single read signal line Sensing in the compensation circuit 13 is connected to the second electrode of the first control transistor of the pixel driving circuits 11 in multiple stages. The respective first control transistors of the pixel driving circuits 11 in multiple stages are respectively controlled, so as to collect data from the pixel driving circuit 11 corresponding to each pixel unit, and compensate for a threshold voltage and mobility of (the drive transistor T1 of) the pixel driving circuit 11.

Specifically, an active level refers to an electrical signal that can turn on a transistor, and an inactive level refers to an electrical signal that cannot turn on the transistor. For example, if a switch transistor can be turned on when a high-level signal is inputted into its gate, the high-level signal, output by a wire connected to the gate of the switch transistor, is the active level for the switch transistor, and correspondingly, a low-level output by this wire is the inactive level for the switch transistor.

Specifically, the terms "level" and "potential" in the embodiments of the present disclosure have the same meaning.

Specifically, taking FIG. 1 as an example, each of the switch transistor T2, the first control transistor T3, and the second control transistor T4 is turned on when a high-level signal is input into the gate. Thus, the active levels of the first scan line WR, the second scan line RD1, and the third scan line RD2 are all high levels, and the inactive levels of the first scan line WR, the second scan line RD1, and the third scan line RD2 are low levels. However, the embodiments of the present disclosure are not limited to this. If each of the switch transistor T2, the first control transistor T3, and the second control transistor T4 is turned on when a low-level signal is input into the gate, the active levels of the first scan line WR, the second scan line RD1, and the third scan line RD2 can be low levels.

In some embodiments, as shown in FIG. 1, the pixel driving circuit 11 further includes a data line Data, the first scan line WR, the second scan line RD1, a first high-level power supply line OVDD, a first low-level power supply line OVSS, and a storage capacitor Cst. The gate of the switch transistor T2 is connected to the first scan line WR, and the first electrode of the switch transistor T2 is connected to the data line Data. The second electrode of the switch transistor T2, the gate of the drive transistor T1, and an electrode plate of the storage capacitor Cst are connected to the first node Q. The first electrode of the drive transistor T1 is connected to the first high-level power supply line OVDD. The second electrode of the drive transistor T1, the other electrode plate of the storage capacitor Cst, and the anode of the light-emitting device LED are connected to the second node A. The gate of the first control transistor T3 is connected to the second scan line RD1. The light-emitting device LED is connected to the first low-level power supply line OVSS.

Specifically, a principle of a compensation process of the pixel driving circuit 11 is as follows. In order to avoid the impact of the compensation process on display, the compensation phase is generally configured to be in start-up or shutdown phases of the display device. During the compensation phase, the first control transistor T3 is turned on, the first scan lines WR of the pixel driving circuits 11 in multiple stages sequentially input high levels to turn on the switch transistors T2, and the data line Data is at a high level. In this way, the compensation circuit 13 in each stage may collect a voltage value output by the pixel driving circuit 11 of the stage to the anode of the light-emitting device LED, and may adjust a data signal output by the data line Data based various voltage values in the display phase, so as to compensate for the threshold voltage and mobility of the transistor T1, thereby avoiding display nonuniformity.

Specifically, as shown in FIG. 2, when the display device is in the compensation phase, the first scan lines WR of the pixel driving circuits 11 in multiple stages are at high levels in sequence, and the second scan lines RD1 of the pixel driving circuits 11 in multiple stages are at high levels in sequence. For example, an $n^{th}$ first scan line WR (n) in an $n^{th}$-stage pixel driving circuit 11 (i.e., the pixel driving circuit 11 in the $n^{th}$-stage) and an $(n+1)^{th}$ first scan line WR (n+1) in an $(n+1)^{th}$-stage pixel driving circuit 11 are at high levels in sequence, and correspondingly, an $n^{th}$ second scan line RD1(n) in the $n^{th}$-stage pixel driving circuit 11 and an $(n+1)^{th}$ second scan line RD1 (n+1) in the $(n+1)^{th}$-stage pixel driving circuit 11 are at high levels in sequence. At this time, all third scan lines RD2 are at low levels. For example, an $n^{th}$ third scan line RD2 (n) in the $n^{th}$-stage pixel driving circuit 11 and an $(n+1)^{th}$ third scan line RD2 (n+1) in the $n^{th}$-stage pixel driving circuit 11 are at low levels, causing the second control transistor T4 to turn off, while the first control transistor T3 and the switch transistor T2 are turned on. At the same time, a first switch S1 is turned on and a second switch S2 is turned off, so that a reset signal may be input into the anode of the light-emitting device LED. Then, the first switch S1 is turned off and the second switch S2 is turned on, so that the compensation circuit 12 may collect a signal of the second node A, and further compensate for the threshold voltage and mobility of the transistor T1. Then, the first switch S1 is turned on and the second switch S2 is turned off to input the reset signal into the anode of the light-emitting device LED again.

Specifically, when the display device is in the collection phase, the pixel driving circuit may work normally. At this time, pixels can be lit or not active (i.e., not displaying content). Take FIG. 2 as an example, where the pixels are lit. In such a case, the first scan lines WR of the of pixel driving circuits 11 in multiple stages receive high levels as their inputs in sequence, all second scan lines RD1 of the pixel driving circuits 11 in multiple stages receive inactive levels as their inputs, and the third scan lines RD2 of the pixel driving circuits 11 in multiple stages are at high levels in sequence. For example, the $n^{th}$ third scan line RD2 (n) in the $n^{th}$-stage pixel driving circuit 11 and the $(n+1)^{th}$ third scan line RD2 (n+1) in the $n^{th}$-stage pixel driving circuit 11 are at high levels in sequence, so that the second control transistor T4 is turned on, the first control transistor T3 is turned off, and the switch transistor T2 is turned on. At the same time, the first switch S1 is turned on and the second switch S2 is turned off, so that the reset signal may be input into the collection module 121. Then, the first switch S1 is turned off and the second switch S2 is turned on, which allows the compensation circuit 12 to collect a signal of the collection module 13, so as to perform corresponding processing based on the signal of the collection module 13. Then, the first switch S1 is turned on and the second switch S2 is turned off to input the reset signal into the collection module 121 again. In this way, the compensation for the transistor T1 of the pixel driving circuit 11 and the signal collection of the collection circuit 13 have been completed.

Specifically, the reset signal may vary between the compensation phase and the collection phase.

Specifically, the above embodiments take a pixel driving circuit including a switch transistor, a drive transistor, and a storage capacitor as an example for description. However, the embodiments of the present disclosure are not limited thereto, and the pixel driving circuit may have other structures.

Specifically, it can be understood that the embodiments of the present disclosure do not limit the type of the thin film transistor(s). When the thin film transistor is an N-type thin film transistor, the thin film transistor is turned on when the gate of the thin film transistor is at a high level. When the thin film transistor is a P-type thin film transistor, the thin film transistor is turned on when the gate of the thin film transistor is at a low level. The one-off state of the thin film transistor is controlled by adjusting a level of a wire connected to the thin film transistor. For example, in FIG. 1, the switch transistor T2 is an N-type thin film transistor, and thus T2 is turned on when the first scan line WR is at a high level. However, the embodiments of the present disclosure are not limited to this. The switch transistor T2 may be a P-type transistor, and correspondingly, T2 is turned on when the first scan line WR is at a low level.

In some embodiments, as shown in FIG. 1, the compensation circuit 13 further includes the first switch S1, the second switch S2, and a reset signal line Vref. One terminal of the first switch S1 is connected to the reset signal line Vref, the other terminal of the first switch S1 is connected to the read signal line Sensing. One terminal of the second switch S2 is connected to the analog-to-digital conversion module ADC, and the other terminal of the second switch S2 is connected to the read signal line Sensing. By arranging the first switch, the second switch, and the reset signal line, the anode of the light-emitting device is reset before the data in the pixel driving circuit is collected, avoiding a voltage at the anode of the light-emitting device from interfering a collection result.

Specifically, when the compensation circuit 13 collects and compensates for the data of the pixel driving circuit 11, the first scan line WR inputs a high level to turn on the switch transistor T2, the first control transistor T3 is turned on, the first switch S1 is turned off, and the anode of the light-emitting device LED is reset. Then, the first switch S1 is turned off and the second switch S2 is turned on, so that the analog-to-digital conversion module ADC may process the data in the pixel driving circuit 11. Then, the second switch S2 is turned off and the first switch S1 is turned on to reset the anode of the light-emitting device LED again, and the data collected by the analog-to-digital conversion module ADC may be used to compensate for the threshold voltage of the thin film transistor T1.

In some embodiments, the collection circuit 12 includes one of a temperature-sensitive sensor collection circuit and an optical sensor collection circuit. When the display device is provided with the collection circuit 12, the collection circuit 12 may include the temperature-sensitive sensor collection circuit and/or the optical sensor collection circuit. Correspondingly, the temperature-sensitive sensor collection circuit and/or the optical sensor collection circuit may share the compensation circuit 13 with the pixel driving circuit 11. In this way, the number of compensation circuits and the number of signal lines in the display device may be reduced, which reduces circuit complexity and occupied space, increasing a screen-to-body ratio of the display device and reducing the complexity and cost of the display device.

Figure 3:
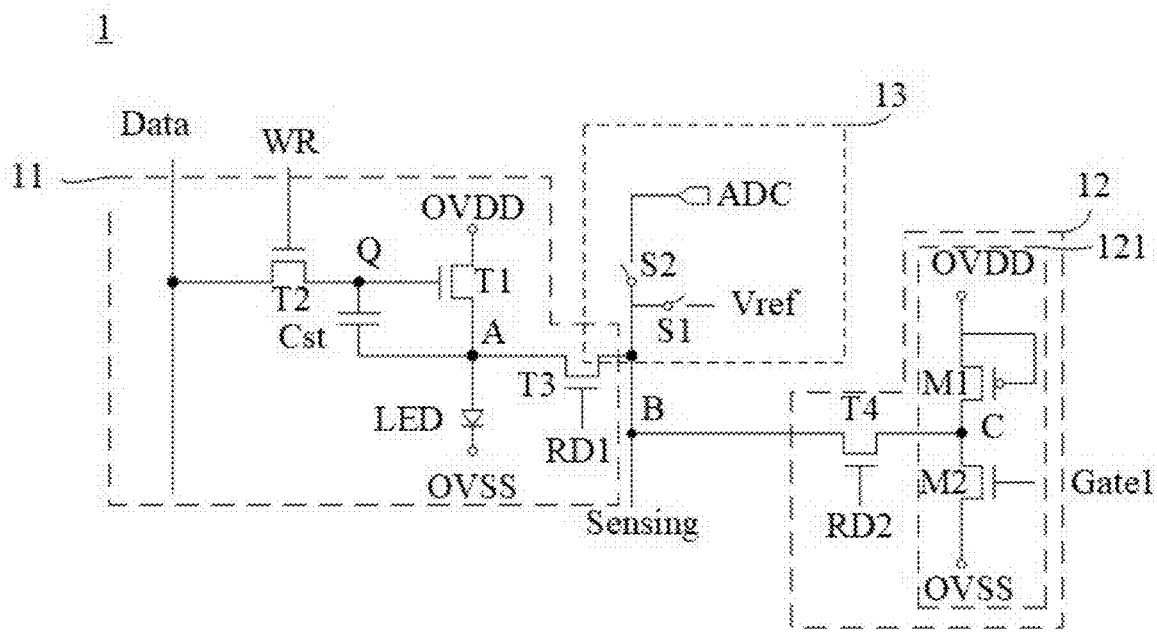
FIG. 3 is a circuit diagram of another display circuit according to some embodiments of the present disclosure.

In some embodiments, as shown in FIG. 3, the collection module 121 includes a first collection transistor M1 and a second collection transistor M2. A gate and a first electrode of the first collection transistor M1 are connected to the first high-level power supply line OVDD. A second electrode of the first collection transistor M1, a second electrode of the second collection transistor M2, and the first electrode of the second control transistor T4 are connected to a fourth node C. A gate of the second collection transistor M2 is connected to a first control line Gate1, and a first electrode of the second collection transistor M2 is connected to the first low-level power supply line OVSS. The collection circuit 12 is configured to include the first collection transistor M1 and the second collection transistor M2, such that the electrical properties of one of the first collection transistor M1 and the second collection transistor M2 change when a temperature in the display circuit changes, and therefore the electrical signal input into the first electrode of the first control transistor T3 changes, which causes the signal collected by the compensation circuit 13 to change, so that a temperature change can be determined and an corresponding process can be executed. In this way, the temperature-sensitive sensor collection circuit and the pixel driving circuit 11 share the compensation circuit 12.

Specifically, the first collection transistor M1 is a low-temperature polysilicon thin film transistor, and the second collection transistor M2 is a metal oxide thin film transistor. In this way, when the temperature changes, the electrical properties of the metal oxide thin film transistor change, then the electrical signal input into the first electrode of the first control transistor changes, so that the signal collected by the compensation circuit 13 changes, allowing to determine the temperature change and execute the corresponding process. This enables the temperature-sensitive sensor collection circuit and the pixel driving circuit 11 to share the compensation circuit.

Specifically, since the electrical properties of the metal oxide thin film transistor will change when the temperature changes, causing the voltage level of the connection node C of the first collection transistor M1 and the second collection transistor M2 to change, the compensation circuit 13 may determine the temperature change based on the change in the voltage level, thereby collecting temperature information and executing the corresponding processing.

Specifically, the metal oxide thin film transistor may be an indium gallium zinc oxide thin film transistor.

Specifically, the gate and the first electrode of the first collection transistor M1 are connected to the first high-level power supply line OVDD, and the first collection transistor M1 will be turned on to a certain extent. At the same time, the first control line Gate1 may turn on the second collection transistor M2, realizing voltage division through the first collection transistor M1 and the second collection transistor M2. A voltage between the first collection transistor M1 the second collection transistor M2 when the temperature in the display circuit does not change is different from the voltage between the first collection transistor M1 and the second collection transistor M2 when the temperature changes, so that whether the temperature has changed may be determined and the amount of the temperature change may be determined when the temperature has changed. This enables the compensation of the pixel driving circuit 11 in the compensation phase, and the collection of the temperature information in the collection phase.

Figure 4:
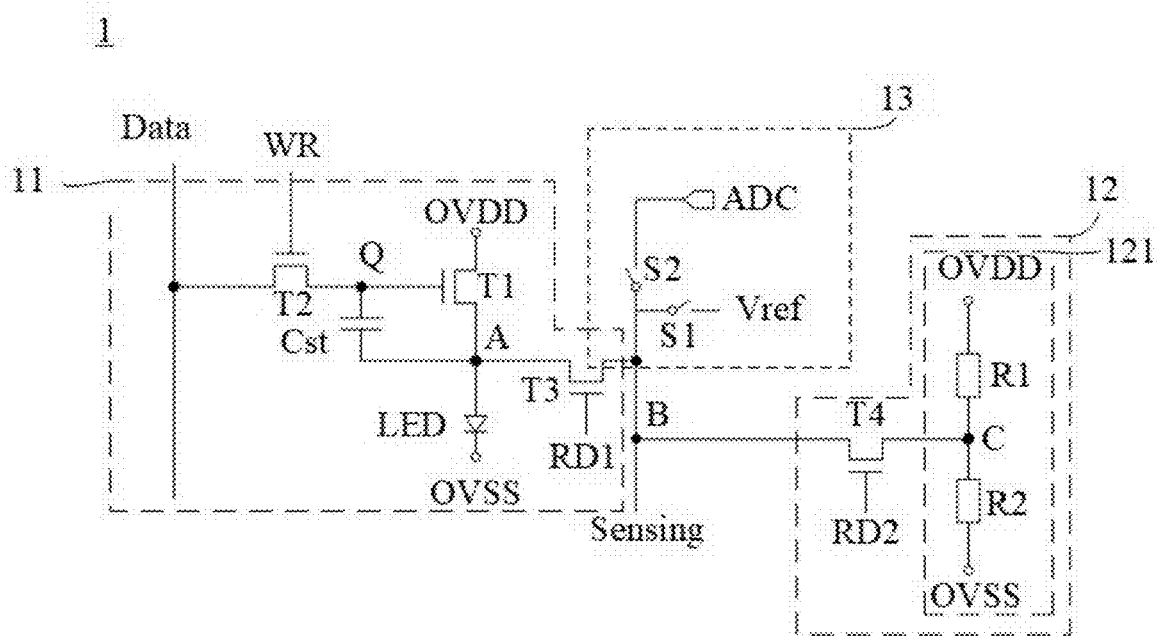
FIG. 4 is circuit diagram of still another display circuit according to some embodiments of the present disclosure.

In some embodiments, as shown in FIG. 4, the collection module 121 includes a temperature-sensitive resistor R1 and a fixed resistor R2. One terminal of the temperature-sensitive resistor R1 is connected to the first high-level power supply line OVDD, and the other terminal of the temperature-sensitive resistor R1 is connected to the first electrode of the second control transistor T4. One terminal of the fixed resistor R2 is connected to the first low-level power supply line OVSS, and the other terminal of the fixed resistor R2 is connected to the first electrode of the second control transistor T4. By setting the temperature-sensitive resistor R1 and the fixed resistor R2 and connecting the resistors R1 and R2 to the first electrode of the second control transistor RD2, when the temperature changes, the resistance of the temperature-sensitive resistor R1 changes, and an electrical signal of the node C, which is connected to the temperature-sensitive resistor R1, the fixed resistor R2, and the second control transistor RD2, will change, so that the compensation circuit 12 may collect the changed electrical signal to determine whether the temperature changes and the amount of the temperature change.

Specifically, the temperature-sensitive resistor R1 can be formed by using a metal layer in the display device, and the fixed resistor R2 can be formed by using a polysilicon layer in the display device. When the temperature changes, the resistivity of the metal will change, while the resistance of the fixed resistor will not change, so that the electrical signal can be changed by the change in the resistance of the temperature-sensitive resistor R1, and the amount of the temperature change can be determined accordingly.

Figure 5:
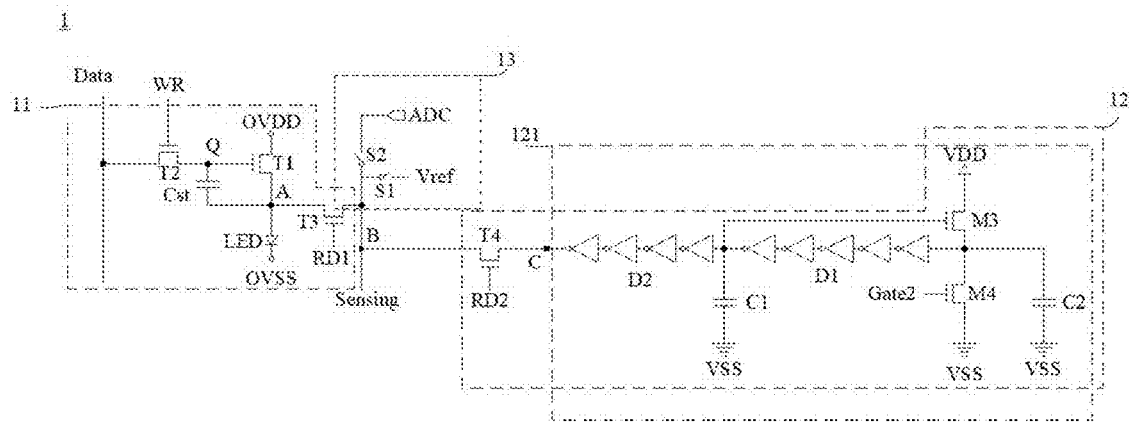
FIG. 5 is a circuit diagram of still another display circuit according to some embodiments of the present disclosure.

In some embodiments, as shown in FIG. 5, the collection module 121 includes a third collection transistor M3, a fourth collection transistor M4, a first capacitor C1, a second capacitor C2, a first frequency ring oscillator D1, and a second frequency ring oscillator D2. A gate of the third collection transistor M3 is connected to one terminal of the first frequency ring oscillator D1, one terminal of the second frequency ring oscillator D2, and one terminal (i.e., electrode plate) of the first capacitor C1. A first electrode of the third collection transistor M3 is connected to a second high-level power supply line VDD. A second electrode of the third collection transistor M3 is connected to one terminal (i.e., electrode plate) of the second capacitor C2, the other terminal of the first frequency ring oscillator D1, and a first electrode of the fourth collection transistor M4. A gate of the fourth collection transistor M4 is connected to a second control line Gate2. A second electrode of the fourth collection transistor M4 is connected to a second low-level signal line VSS. The other electrode plate of the first capacitor C1 and the other electrode plate of the second capacitor C2 are connected to the second low-level signal line VSS. The other terminal of the second frequency ring oscillator D2 is connected to the first electrode of the second control transistor T4. The fourth collection transistor M4 is provided, such that the electrical properties of the fourth collection transistor M4 change when the temperature changes, causing signals output by the first frequency ring oscillator D1 and the second frequency ring oscillator D2 to change, so as to determine whether the temperature has changed and the amount of the temperature change when the temperature has changed and to perform the corresponding processing. This enables the compensation of the pixel driving circuit 11 in the compensation phase, and the collection of the temperature information in the collection phase.

Specifically, the fourth collection transistor M4 may be a transistor whose electrical properties change when the temperature changes. In such a case, when the temperature changes, a voltage level of the second electrode of the fourth collection transistor M4 changes. Correspondingly, the signals output by the first frequency ring oscillator D1 and the second frequency ring oscillator D2 change, so that the compensation circuit 13 can determine the temperature change based on the change of the signal output by the second frequency ring oscillator D2.

Specifically, the fourth collection transistor M4 may be a metal oxide thin film transistor, for example, the fourth collection transistor may be an indium gallium zinc oxide thin film transistor.

Specifically, the second high-level power supply line VDD may be the same line as the first high-level power supply line OVDD, and the second low-level signal line VSS may be the same line as the first low-level power supply line OVSS.

Figure 6:
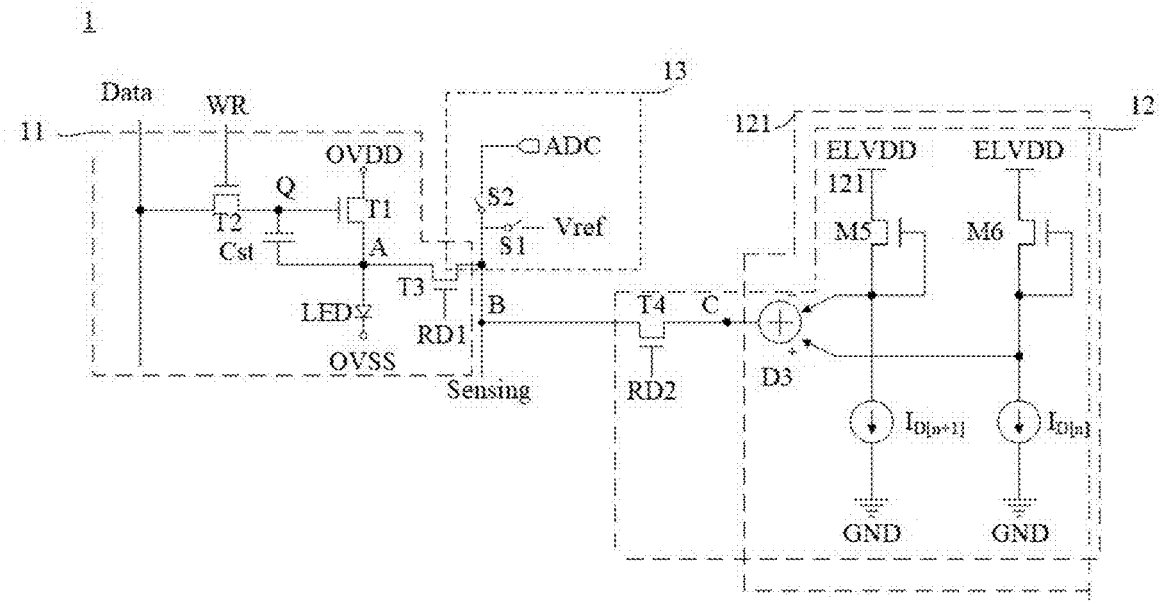
FIG. 6 is a circuit diagram of still another display circuit according to some embodiments of the present disclosure.

In some embodiments, as shown in FIG. 6, the collection module 121 includes a fifth collection transistor M5, a sixth collection transistor M6, a first current source $ID_{(n+1)}$, a second current source $ID_{(n)}$, and a differentiator D3. A first electrode of the fifth collection transistor M5 is connected to a third high-level power supply line ELVDD, and a gate of the fifth collection transistor M5 and a second electrode of the fifth collection transistor M5 are connected to (one terminal of) the first current source $ID_{(n+1)}$ and an input terminal of the differentiator D3. A first electrode of the sixth collection transistor M6 is connected to the third high-level power supply line ELVDD, and a gate and a second electrode of the sixth collection transistor M6 are connected to (one terminal of) the second current source $ID_{(n)}$ and the other input terminal of the differentiator D3. An output terminal of the differentiator D3 is connected to the first electrode of the second control transistor T4. The fifth collection transistor M5 and the sixth collection transistor M6 are arranged such that, the electrical properties of the fifth collection transistor M5 and the sixth collection transistor M6 change when the temperature changes, causing a signal output by the differentiator D3 to change, thereby it is possible to determine whether the temperature has changed and the amount of the temperature change when the temperature has changed and to perform the corresponding processing. This enables the compensation of the pixel driving circuit 11 in the compensation phase, and the collection of the temperature information in the collection phase. In addition, the differentiator D3 can eliminate errors caused by interference from other factors and improve the accuracy of collected data.

Specifically, the fifth collection transistor M5 and the sixth collection transistor M6 may be transistors whose electrical properties change when the temperature changes. In such a case, when the temperature changes, voltage levels of the second electrode of the fifth collection transistor M5 and the second electrode of the sixth collection transistor M5 change, and accordingly, the signal output by the differentiator D3 changes, so that the collection circuit 12 can determine the temperature change through the change of the signal.

Specifically, the fifth collection transistor M5 and the sixth collection transistor M6 may be metal oxide thin film transistors. For example, the fifth collection transistor M5 and the sixth collection transistor M6 may be indium gallium zinc oxide thin film transistors.

Specifically, the fifth collection transistor M5 and the sixth collection transistor M6 can be replaced by triodes.

Specifically, the other terminals of the first current source $ID_{(n+1)}$ and the second current source $ID_{(n)}$ may be grounded.

Specifically, the third high-level power supply line ELVDD may be the same line as the first high-level power supply line OVDD.

Figure 7:
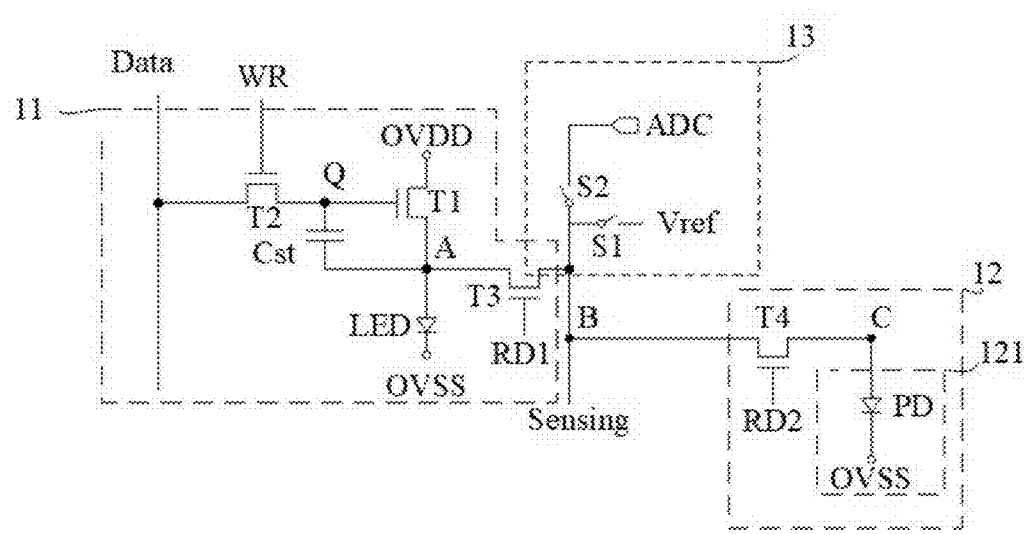
FIG. 7 is a circuit diagram of still another display circuit according to some embodiments of the present disclosure.

In some embodiments, as shown in FIG. 7, the collection module 121 includes a photodiode PD. An anode of the photodiode PD is connected to the first electrode of the second control transistor T4, and a cathode of the photodiode PD is connected to the first low-level power supply line OVSS. The collection circuit 12 is configured to include the photodiode PD such that the impedance of the photodiode PD will change when light changes, and therfore the electrical signal of the node C connected to the first electrode of the second control transistor T4 will change. In this way, the changed electrical signal may be collected through the compensation circuit 13, and the corresponding processing may be performed.

Specifically, the collection circuit 12 is configured to include the photodiode PD to detect ambient light, which realizes fingerprint collection and recognition, and enables the collection circuit 12 and the pixel driving circuit 11 to share the compensation circuit 13.

Specifically, the collection circuit 12 may further include an infrared sensor, through which distance and biometric identification can be performed.

In some embodiments, the display circuit includes a plurality of collection circuits 12 arranged in an array, and the number of read signal lines Sensing is greater than or equal to the number of columns of the collection circuits 12. Considering that a column of collection circuits 12 will be connected to a corresponding read signal line Sensing, in order to enable the collection circuits 12 and the pixel driving circuits 11 to share the reading signal line Sensing, the number of columns of the collection circuits 12 is less than or equal to the number of read signal lines Sensing.

Specifically, it can be understood that a column of collection circuits 12 may include the collection circuits 12 in multiple stages. A single column of collection circuits 12 may be connected to one and the same read signal line Sensing. The second control transistors T4 in the collection circuits 12 in the multiple stages are controlled to turn on in sequence respectively through the third scan lines RD2. Hence, the signals in the collection circuits 12 in the multiple stages are collected respectively. Therefore, in the configuration of the collection circuits 12, the number of the columns of the collection circuits 12 may be less than or equal to the number of the read signal lines Sensing, so as to share the read signal lines Sensing with the pixel driving circuits 11.

In some embodiments, some embodiments of the present disclosure provide a display device, which includes the display circuit described in any of the above embodiments.

In some embodiments, the display device includes a first substrate, a display panel, a liquid crystal layer, a control electrode layer, and a second substrate. The display panel is disposed on one side of the first substrate. The liquid crystal layer is disposed on a side of the display panel away from the first substrate. The control electrode layer is disposed on a side of the liquid crystal layer away from the display panel. The second substrate is disposed on a side of the control electrode layer away from the liquid crystal layer.

Figure 8:
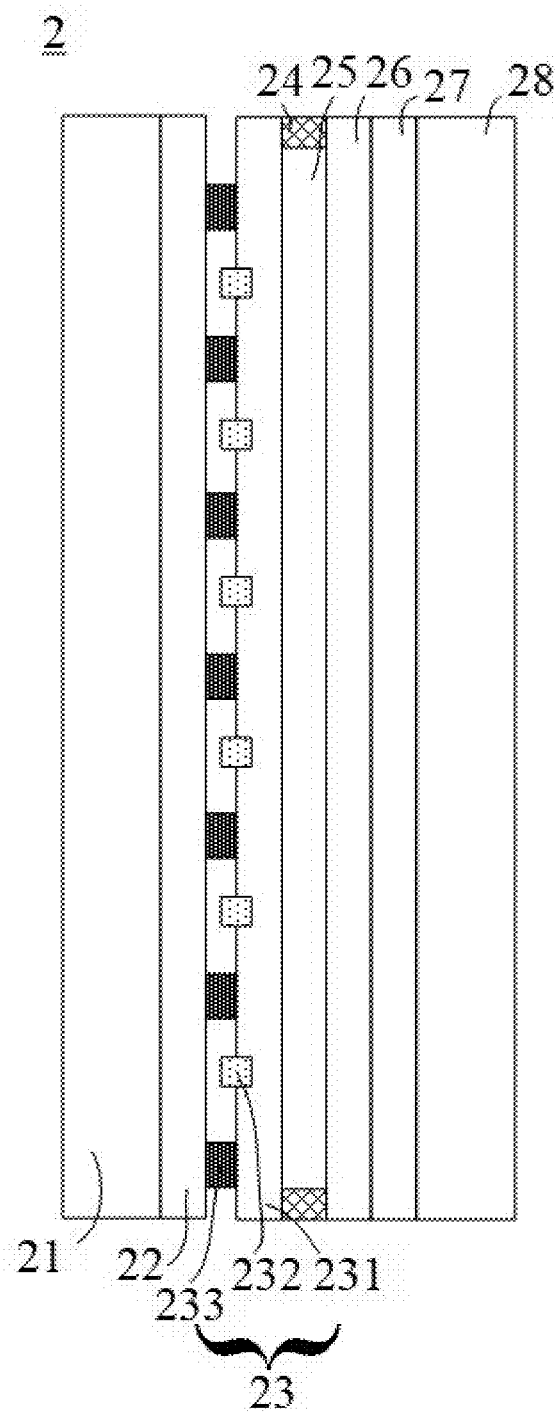
FIG. 8 is a schematic diagram of a display device according to some embodiments of the present disclosure.

In some embodiments, as shown in FIG. 8, the display device 2 includes a first substrate 21, a first polarizer 22, a display panel 23, a liquid crystal layer 25, a control electrode layer 26, a second polarizer 27, and a second substrate 28. The first polarizer 22 is disposed on one side of the first substrate 21. The display panel 23 is disposed on a side of the first polarizer 22 away from the first substrate 21. The liquid crystal layer 25 is disposed on a side of the display panel 23 away from the first polarizer 22. The control electrode layer 26 is disposed on a side of the liquid crystal layer 25 away from the display panel 23. The second polarizer 27 is disposed on a side of the control electrode layer 26 away from the liquid crystal layer 25. The second substrate 28 is disposed on a side of the second polarizer 27 away from the control electrode layer 26. By configuring the display device to include the display panel, the liquid crystal layer, and the polarizers, the display device may perform normal display through the display panel, or achieve transparent display (also referred to as sec-through display) through the liquid crystal layer and the polarizers.

Specifically, as shown in FIG. 8, the display panel 23 includes a display substrate 231, a plurality of photodiodes 232, and a plurality of light emitting units 233. Specifically, as shown in FIG. 8, the display device 2 further includes a sealant 24, which is disposed on both ends of the liquid crystal layer 25.

Specifically, the first substrate 21 and the second substrate 28 may be regarded as inner glass and outer glass of a car window, thereby realizing transparent display of the car window or displaying images through the display panel (i.e., the normal display as described above).

Specifically, the control electrode layer 26 can be disposed on a substrate.

Figure 9:
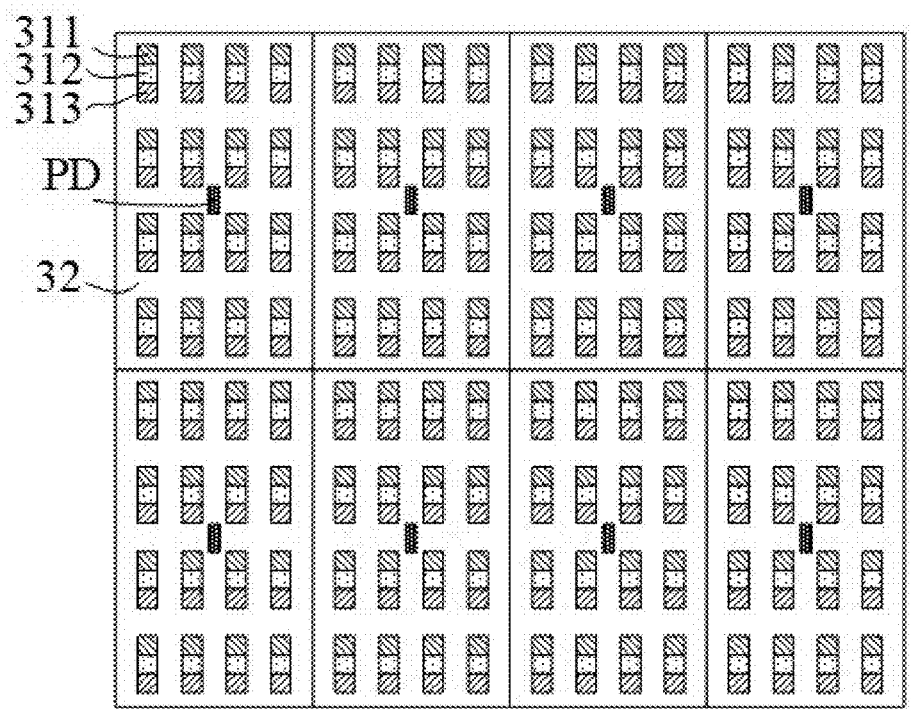
FIG. 9 is a schematic diagram of a display panel and a control electrode layer according to some embodiments of the present disclosure.
Figure 9:
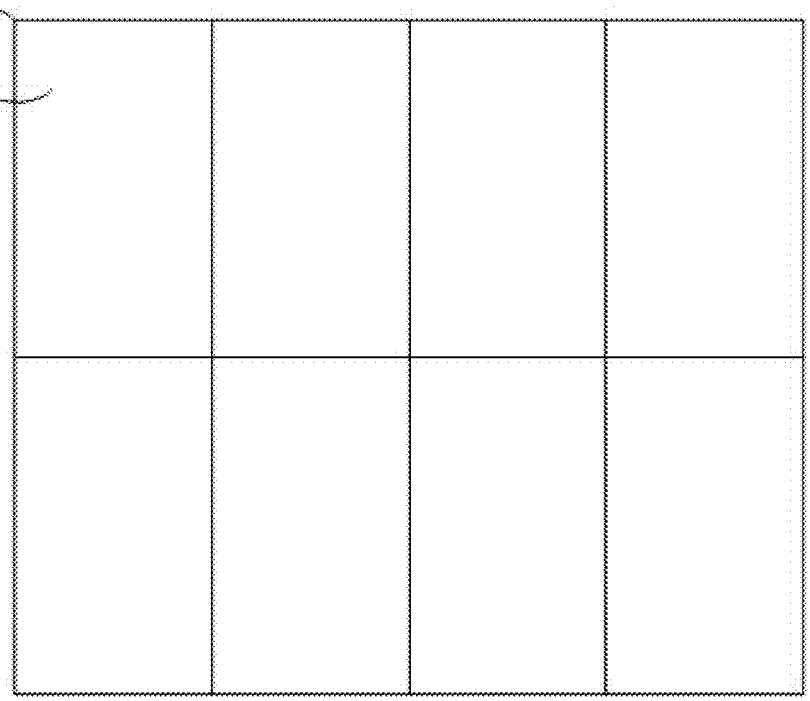

In some embodiments, as shown in FIG. 9, the display panel 23 includes the photodiodes 232 and the light-emitting units 233. The display panel includes a plurality of sub-regions, and each sub-region is provided with a plurality of light-emitting units 233 and one photodiode 232. The control electrode layer 26 includes a plurality of control electrodes 33 arranged at intervals, and each of the control electrodes 33 is arranged corresponding to one of the plurality of sub-regions 32.

Specifically, as shown in FIG. 9, FIG. 9 (a) shows that the display panel 23 can be divided into the plurality of sub-regions 32. Each sub-region 32 is provided with multiple pixel units and a single photodiode PD. Each pixel unit includes a first sub-pixel unit 311, a second sub-pixel unit 312, and a third sub-pixel unit 313. Each sub-pixel unit can be one light-emitting unit 233, and the ambient light can be detected through the photodiode PD in each sub-region 32. As shown in FIG. 9 (b), the control electrode layer 26 may be divided into the plurality of control electrodes 33 respectively corresponding to the plurality of sub-regions 32, so that the liquid crystals in each sub-region may be controlled to control the corresponding light transmittance.

Specifically, it can be understood that FIG. 9 shows a boundary of each sub-region to illustrate a design of each sub-region, but in actual design, such boundary does not exist.

Specifically, it can be understood that the control electrodes 33 in FIG. 9 are arranged at intervals and do not contact each other.

Specifically, the display panel can include a plurality of electrode layers. The electrode layer close to the liquid crystal layer 25 in the display panel may be also used as an electrode layer for controlling the liquid crystal layer 25, so that the electrode layer transmits low-level signals. That is, the control electrode layer 26 serves as the pixel electrode of the liquid crystal layer, and another one of the plurality of electrode layers in the display panel serves as a common electrode of the liquid crystal layer 25.

Figure 10:
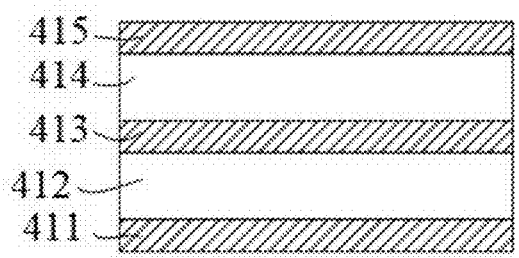
FIG. 10 is a schematic diagram of an arrangement of film layers of the display panel according to some embodiments of the present disclosure.

Specifically, as shown in FIG. 10, the display panel 23 includes a first electrode layer 411, a first insulating layer 412, a second electrode layer 413, a second insulating layer 414, and a third electrode layer 415. The first electrode layer 411 is disposed on a side of the second electrode layer 413 close to the liquid crystal layer 25. The third electrode layer 415 is disposed on a side of the second electrode layer 413 away from the first electrode layer 411. The first electrode layer 411 is disposed between the first insulating layer 412 and the liquid crystal layer 25. The first electrode layer 411 includes a common electrode. By configuring the first electrode layer 411 to include the common electrode, the first electrode layer 411 can serve as both the common electrode of the liquid crystal layer 25 and an electrode of the display panel, thereby reducing the thickness of the display device.

Specifically, the display substrate 231 may be disposed between the first electrode layer 411 and the liquid crystal layer.

Specifically, the first electrode layer 411 may have a mesh structure. The first electrode layer 411 may transmit signals of the low-level power supply line, and the second electrode layer 413 may transmit signals of the high-level power supply line.

Specifically, a material of each electrode layer may be metal or indium tin oxide, and a material of the control electrode layer 26 may be indium tin oxide.

Specifically, a working principle of the display device is as follows. The collection circuit 12 detects the intensity, direction, and illuminated sub-region(s) of external ambient light, and adjusts a deflection direction of the liquid crystals in the liquid crystal layer 25 based on the detected intensity, direction, and illuminated sub-region of the external ambient light, to achieve different light transmittances in different sub-regions, and then adjust the brightness and color temperature of the display panel according to a transmission state of the ambient light.

Specifically, when the display device displays, all sub-regions may adopt the transparent display, all sub-regions may adopt the display panel's display, or some sub-regions may adopt the transparent display and some sub-regions may adopt the display panel's display.

Specifically, the photodiodes PD may be placed at the bottom of the display panel so that the photodiodes PD can sense light from the bottom. At the same time, a non-photosensitive side of each photodiode PD can be shielded by a metal structure, such as a metal sheet, to avoid interference from the light emitting unit 233.

In some embodiments, the photodiodes PD are disposed on a side of the third electrode layer 415 close to the second electrode layer 413. The third electrode layer 415 includes light-shielding metal portions, and the light-shielding metal portions are configured corresponding to the photodiodes PD. By arranging the photodiodes PD corresponding to the light-shielding metal portions of the third electrode layer 415, the side of the photodiodes PD close to the liquid crystal layer 25 may be used to detect light, and the side of the photodiodes PD close to the third electrode layer 415 may be shielded from light, thus preventing light emission inside the display device from affecting the photosensitivity effect.

Figure 11:
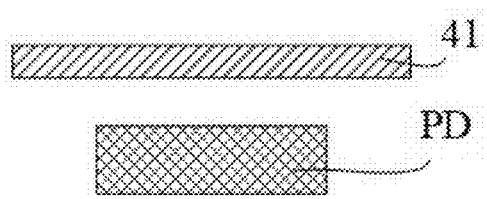
FIG. 11 is a schematic diagram of another arrangement of film layers of the display panel according to some embodiments of the present disclosure.

Specifically, as shown in FIG. 11, the display panel 23 includes the metal layer 41 and the photodiodes PD. The non-photosensitive side of the photodiodes PD is arranged corresponding to the metal layer 41. It can be understood that the metal layer 41 may be one of the above-mentioned electrode layers, for example, the metal layer 41 may be the third electrode layer 415.

Specifically, the light-emitting units 233 may be micro-light-emitting diodes (MLEDs).

In some embodiments, the display device includes a plurality of collection circuits 12 arranged in an array, and the number of the read signal lines Sensing is greater than or equal to the number of the columns of the collection circuits 12. Considering that a column of collection circuits 12 will be connected to a corresponding read signal line Sensing, the number of the columns of the collection circuits 12 is less than or equal to the number of the read signal lines Sensing to enable the collection circuits 12 and the pixel driving circuits 11 to share the reading signal lines Sensing,.

Specifically, it can be understood that a column of collection circuits 12 may include collection circuits 12 in multiple stages. A single column of collection circuits 12 may be connected to one and the same read signal line Sensing. The second control transistors T4 in the collection circuits 12 in the multiple stages are controlled to turn on in sequence respectively through the third scan lines RD2. Hence, the signals in the collection circuits 12 in the multiple stages are collected respectively. Therefore, in the configuration of the collection circuits 12, the number of the columns of the collection circuits 12 may be less than or equal to the number of the read signal lines Sensing, so as to share the read signal lines Sensing with the pixel driving circuits 11.

In some embodiments, the display device further includes a driver chip. The driver chip includes a plurality of output channels, and one of the output channels is connected to one or more read signal lines Sensing.

Specifically, it can be understood that each read signal line Sensing is connected to one of the output channels of the driver chip, and it is possible that one read signal line Sensing is connected to one output channel of the driver chip, or that multiple read signal lines Sensing are connected to one output channel of the driver chip.

Specifically, the compensation circuit 13 can be arranged in the driver chip, and the collection circuits 12 and the pixel driving circuits 11 are arranged in the display panel.

In the above embodiments, each embodiment has its own emphasis in description. For parts that are not described in detail in a certain embodiment, please refer to the relevant descriptions of other embodiments.

The above has introduced in detail a display circuit and a display device provided by some embodiments of the present disclosure. Specific examples are used in the description to illustrate the principles and implementation manners of the present disclosure. The description of the above embodiments is only used to help understand the technical solutions and core ideas of the present disclosure. Persons of ordinary skill in the art shall understand that they may still modify the technical solutions described in the foregoing embodiments or make equivalent substitutions for some of the technical features, however, such modification or substitution shall not remove the essence of the corresponding technical solutions from the scope of the present disclosure.

What is claimed is:

1. A display circuit, comprising:
    multiple pixel driving circuits arranged in multiple stages, wherein each pixel driving circuit includes a switch transistor, a drive transistor, and a first control transistor, a gate of the switch transistor is connected to a first scan line, a first electrode of the switch transistor and a gate of the drive transistor is connected to a first node, the drive transistor is electrically connected to an anode of a light-emitting device, a gate of the first control transistor is connected to a second scan line, and a first electrode of the first control transistor is connected to the anode of the light-emitting device;
    multiple collection circuits arranged in multiple stages, wherein each collection circuit comprises a second control transistor and a collection module, a gate of the second control transistor is connected to a third scan line, and a first electrode of the second control transistor is connected to the collection module;
    a compensation circuit comprising a read signal line and an analog-to-digital conversion module, wherein the read signal line is connected to a second electrode of the second control transistor of each pixel driving circuit, is connected to a second electrode of the second control transistor of each collection circuit, and is further electrically connected to the analog-to-digital conversion module;
    wherein when the display circuit is configured to be in a compensation phase, active voltage levels are respectively input into the first scan line and the second scan line, and an inactive voltage level is input into the third scan line, and
    when the display circuit is configured to be in a collection phase, an inactive voltage level is input into the second scan line, and an active voltage level is input into the third scan line.

2. The display circuit of claim 1, wherein the collection circuit comprises one of a temperature-sensitive sensor collection circuit and an optical sensor collection circuit.

3. The display circuit of claim 2, wherein the collection module comprises a first collection transistor and a second collection transistor,
    a gate and a first electrode of the first collection transistor is connected to a first high-level power supply line,
    a second electrode of the first collection transistor and a second electrode of the second collection transistor are connected with the first electrode of the second control transistor,
    a gate of the second collection transistor is connected to a first control line, and
    a first electrode of the second collection transistor is connected to a first low-level power supply line.

4. The display circuit of claim 2, wherein the collection module comprises a temperature-sensitive resistor and a fixed resistor,
   one terminal of the temperature-sensitive resistor is connected to a first high-level power supply line, and the other terminal of the temperature-sensitive resistor is connected to the first electrode of the second control transistor, and
   one terminal of the fixed resistor is connected to a first low-level power supply line, and the other terminal of the fixed resistor is connected to the first electrode of the second control transistor.

5. The display circuit of claim 2, wherein the collection module comprises a third collection transistor, a fourth collection transistor, a first capacitor, a second capacitor, a first frequency ring oscillator, and a second frequency ring oscillator,
   a gate of the third collection transistor is connected to one terminal of the first frequency ring oscillator, one terminal of the second frequency ring oscillator, and one electrode plate of the first capacitor,
   a first electrode of the third collection transistor is connected to a second high-level power supply line, a second electrode of the third collection transistor is connected to one electrode plate of the second capacitor, the other terminal of the first frequency ring oscillator, and a first electrode of the fourth collection transistor,
   a gate of the fourth collection transistor is connected to a second control line, a second electrode of the fourth collection transistor is connected to a second low-level signal line,
   the other electrode plate of the first capacitor and the other electrode plate of the second capacitor are connected to the second low-level signal line, and
   the other terminal of the second frequency ring is connected to the first electrode of the second control transistor.

6. The display circuit of claim 2, wherein the collection module comprises a fifth collection transistor, a sixth collection transistor, a first current source, a second current source, and a differentiator,
   a first electrode of the fifth collection transistor is connected to a third high-level power supply line, and a gate of the fifth collection transistor and a second electrode of the fifth collection transistor are connected to the first current source and an input terminal of the differentiator,
   a first electrode of the sixth collection transistor is connected to the third high-level power supply line, and a gate and a second electrode of the sixth collection transistor are connected to the second current source and the other input terminal of the differentiator, and
   an output terminal of the differentiator is connected to the first electrode of the second control transistor.

7. The display circuit of claim 2, wherein the collection module comprises a photodiode, an anode of the photodiode is connected to the first electrode of the second control transistor, and a cathode of the photodiode is connected to a first low-level power supply line.

8. The display circuit of claim 1, wherein the display circuit comprises a plurality of collection circuits arranged in an array, and the number of the read signal line is greater than or equal to the number of columns of the array.

9. The display circuit according to claim 1, wherein the compensation circuit further comprises a first switch, a second switch, and a reset signal line,
   one terminal of the first switch is connected to the reset signal line, the other terminal of the first switch is connected to the read signal line, and
   one terminal of the second switch is connected to the analog-to-digital conversion module, and the other terminal of the second switch is connected to the read signal line.

10. A display device, comprising:
   a first substrate;
   a display panel provided on one side of the first substrate;
   a liquid crystal layer disposed on a side of the display panel facing away from the first substrate;
   a control electrode layer disposed on a side of the liquid crystal layer facing away from the display panel; and
   a second substrate disposed on a side of the control electrode layer facing away from the liquid crystal layer;
   wherein the display device comprises a display circuit, and the display circuit comprises:
      multiple pixel driving circuits arranged in multiple stages, wherein each pixel driving circuit includes a switch transistor, a drive transistor, and a first control transistor, a gate of the switch transistor is connected to a first scan line, a first electrode of the switch transistor and a gate of the drive transistor is connected to a first node, the drive transistor is electrically connected to an anode of a light-emitting device, a gate of the first control transistor is connected to a second scan line, and a first electrode of the first control transistor is connected to the anode of the light-emitting device;
      multiple collection circuits arranged in multiple stages, wherein each collection circuit comprises a second control transistor and a collection module, a gate of the second control transistor is connected to a third scan line, and a first electrode of the second control transistor is connected to the collection module;
      a compensation circuit comprising a read signal line and an analog-to-digital conversion module, wherein the read signal line is connected to a second electrode of the second control transistor of each pixel driving circuit, is connected to a second electrode of the second control transistor of each collection circuit, and is further electrically connected to the analog-to-digital conversion module;
      wherein when the display circuit is configured to be in a compensation phase, active voltage levels are respectively input into the first scan line and the second scan line, and an inactive voltage level is input into the third scan line, and
      when the display circuit is configured to be in a collection phase, an inactive voltage level is input into the second scan line, and an active voltage level is input into the third scan line.

11. The display device of claim 10, wherein the display panel comprises photodiodes and light-emitting units,
   the display panel has a plurality of sub-regions, and each sub-region is provided with two or more of the light-emitting units and one of the photodiodes, and
   the control electrode layer comprises a plurality of control electrodes arranged at intervals, and each control electrode is arranged corresponding to one of the plurality of sub-regions.

12. The display device of claim 11, wherein the display panel comprises a first electrode layer, a first insulating layer, a second electrode layer, a second insulating layer, and a third electrode layer, the first electrode layer is disposed on a side of the second electrode layer facing toward the liquid crystal layer, the third electrode layer is disposed on a side of the second electrode layer facing away from the first electrode layer, and the first electrode layer comprises a common electrode.

13. The display device of claim 12, wherein the photodiode is disposed on a side of the third electrode layer facing toward the second electrode layer, and the third electrode layer comprises a light-shielding metal portion, and the light-shielding metal portion is configured corresponding to the photodiode.

14. The display device of claim 10, wherein the collection circuit comprises one of a temperature-sensitive sensor collection circuit and an optical sensor collection circuit.

15. The display device of claim 14, wherein the collection module comprises a first collection transistor and a second collection transistor, a gate and a first electrode of the first collection transistor is connected to a first high-level power supply line, a second electrode of the first collection transistor and a second electrode of the second collection transistor are connected with the first electrode of the second control transistor, a gate of the second collection transistor is connected to a first control line, and a first electrode of the second collection transistor is connected to a first low-level power supply line.

16. The display device of claim 14, wherein the collection module comprises a temperature-sensitive resistor and a fixed resistor, one terminal of the temperature-sensitive resistor is connected to a first high-level power supply line, and the other terminal of the temperature-sensitive resistor is connected to the first electrode of the second control transistor, and one terminal of the fixed resistor is connected to a first low-level power supply line, and the other terminal of the fixed resistor is connected to the first electrode of the second control transistor.

17. The display device of claim 14, wherein the collection module comprises a third collection transistor, a fourth collection transistor, a first capacitor, a second capacitor, a first frequency ring oscillator, and a second frequency ring oscillator, a gate of the third collection transistor is connected to one terminal of the first frequency ring oscillator, one terminal of the second frequency ring oscillator, and one electrode plate of the first capacitor, a first electrode of the third collection transistor is connected to a second high-level power supply line, a second electrode of the third collection transistor is connected to one electrode plate of the second capacitor, the other terminal of the first frequency ring oscillator, and a first electrode of the fourth collection transistor, a gate of the fourth collection transistor is connected to a second control line, a second electrode of the fourth collection transistor is connected to a second low-level signal line, the other electrode plate of the first capacitor and the other electrode plate of the second capacitor are connected to the second low-level signal line, and the other terminal of the second frequency ring is connected to the first electrode of the second control transistor.

18. The display device of claim 14, wherein the collection module comprises a fifth collection transistor, a sixth collection transistor, a first current source, a second current source, and a differentiator, a first electrode of the fifth collection transistor is connected to a third high-level power supply line, and a gate of the fifth collection transistor and a second electrode of the fifth collection transistor are connected to the first current source and an input terminal of the differentiator, a first electrode of the sixth collection transistor is connected to the third high-level power supply line, and a gate and a second electrode of the sixth collection transistor are connected to the second current source and the other input terminal of the differentiator, and an output terminal of the differentiator is connected to the first electrode of the second control transistor.

19. The display device of claim 14, wherein the collection circuit is provided in the display panel, the collection module comprises a photodiode of the photodiodes of the display panel, an anode of the photodiode is connected to the first electrode of the second control transistor, and a cathode of the photodiode is connected to a first low-level power supply line.

20. The display device of claim 10, wherein the display circuit comprises a plurality of collection circuits arranged in an array, and the number of the read signal lines is greater than or equal to the number of columns of the collection circuits.

* * * * *